United States Patent
Fujikawa et al.

(10) Patent No.: US 7,993,706 B2
(45) Date of Patent: Aug. 9, 2011

(54) METHOD OF FORMING A NANO-STRUCTURE AND THE NANO-STRUCTURE

(75) Inventors: Shigenori Fujikawa, Fujimi (JP); Toyoki Kunitake, Fukuoka (JP); Hideo Hada, Kawasaki (JP); Toshiyuki Ogata, Kawasaki (JP)

(73) Assignee: Riken, Saitama (JP)

(*) Notice: Subject to any disclaimer, the term of this patent is extended or adjusted under 35 U.S.C. 154(b) by 993 days.

(21) Appl. No.: 11/628,793

(22) PCT Filed: Jun. 8, 2005

(86) PCT No.: PCT/JP2005/010899
§ 371 (c)(1),
(2), (4) Date: Sep. 7, 2007

(87) PCT Pub. No.: WO2005/121019
PCT Pub. Date: Dec. 22, 2005

(65) Prior Publication Data
US 2008/0050564 A1    Feb. 28, 2008

(30) Foreign Application Priority Data
Jun. 8, 2004   (JP) ................. 2004-169398

(51) Int. Cl.
*B82B 3/00*   (2006.01)
*C01B 33/12*  (2006.01)
*H01L 21/027* (2006.01)

(52) U.S. Cl. ........ 427/264; 427/256; 427/258; 427/261; 427/270; 427/271; 427/275; 427/276; 427/272; 427/282; 438/400; 438/424

(58) Field of Classification Search .............. 427/58, 427/96.1, 96.4, 97.1, 97.3, 98.4, 256, 258, 427/261, 264, 265, 270, 271, 96.8, 282
See application file for complete search history.

(56) References Cited

U.S. PATENT DOCUMENTS

| | | | |
|---|---|---|---|
| 4,968,552 A | | 11/1990 | Linde |
| 5,627,013 A | * | 5/1997 | Kamisawa ............ 430/325 |
| 5,688,723 A | | 11/1997 | Okamoto et al. |
| 5,776,788 A | * | 7/1998 | Aoki et al. ............. 438/396 |
| 6,063,688 A | | 5/2000 | Doyle et al. |
| 6,555,886 B1 | * | 4/2003 | Xu et al. ............... 257/410 |
| 6,679,996 B1 | * | 1/2004 | Yao ....................... 216/40 |

(Continued)

FOREIGN PATENT DOCUMENTS

EP    0238690 A1    9/1987

(Continued)

OTHER PUBLICATIONS

Machine Translation of JP 2003-077922 (no date available).*

(Continued)

*Primary Examiner* — Michael Cleveland
*Assistant Examiner* — Lisha Jiang
(74) *Attorney, Agent, or Firm* — Birch, Stewart, Kolasch & Birch, LLP

(57) ABSTRACT

A method of forming a nano-structure can form a fine pattern easily, and the nano-structure obtained by the method is provided. A method of forming a nano-structure comprising forming a thin film by a liquid phase adsorption on surface of a template formed on a substrate, and removing a portion of the thin film, and removing the template is used.

5 Claims, 9 Drawing Sheets

U.S. PATENT DOCUMENTS

| | | |
|---|---|---|
| 2002/0190251 A1 | 12/2002 | Kunitake et al. |
| 2003/0006410 A1 | 1/2003 | Doyle |
| 2003/0124468 A1 | 7/2003 | Ferbitz et al. |
| 2005/0129935 A1 | 6/2005 | Kunitake et al. |
| 2008/0032139 A1* | 2/2008 | Le Blevennec et al. ...... 428/446 |

FOREIGN PATENT DOCUMENTS

| | | | |
|---|---|---|---|
| JP | 05325185 A | * | 12/1993 |
| JP | 6-224161 A | | 8/1994 |
| JP | 10-150027 A | | 6/1998 |
| JP | 2002-338211 A | | 11/2002 |
| JP | 2003-077922 A | | 3/2003 |
| WO | WO-2003/095193 A1 | | 11/2003 |

OTHER PUBLICATIONS

Machine Translation of JP 1994-224161 (no date available).*
Search Report from corresponding European Application No. 05751208.9 dated Oct. 6, 2010.

* cited by examiner

METHOD OF FORMING A NANO-STRUCTURE AND THE NANO-STRUCTURE

This application is the National Stage under 35 U.S.C. §371 of International Application No. PCT/JP2005/010899 filed on Jun. 8, 2005, which claims priority under 35 U.S.C. §119(a)-(d) of Application No. 2004/169398 filed in Japan on Jun. 8, 2004.

TECHNICAL FIELD

The present invention relates to a method of forming a nano-structure for forming a fine pattern used, for example, in semiconductor industries, and a nano-structure obtained by the method.

TECHNICAL BACKGROUND

A technique of forming a fine pattern has been widely used, for example, for formation of IC in semiconductor industries and has attracted a lot of attention. In particular, 2-dimensional fine patterns are relevant to manufacture and increase in integration of integrated circuits, thus, research and development of the 2-dimensional fine patterns have been vigorously conducted. Miniaturization of the 2-dimensional pattern has been conducted generally by various techniques of direct depiction utilizing beam, light, electron, ion, and the like, or projection and transfer of given mask patterns (photolithography, nano-imprint, and the like.)

For example, the lithographic method is industrially developed most vigorously, and the basic concept for proceeding miniaturization thereof is in "shortening the wavelength of light or electron beam to be irradiated, thereby, conducting fine fabrication". Accordingly, it is a basic tactics to shorten the wavelength of a light and the like to be irradiated and develop materials and equipments corresponding thereto. However, the tactics require extremely expensive apparatus using short wavelength light, thereby, enormous investment is necessary for the facility of the process per se. In addition, it is necessary to design materials and processes such that the effect of the wavelength can be exerted to the utmost extent. Further, resist materials required for the lithographic method require various conditions in view of design material; not absorbing an irradiated light even at short wavelength, introducing given functional groups for improving the exposure accuracy, and enhancing the etching resistance in the subsequent treatment.

Further, electron and ion beam fabrication other than the photolithographic method are individual direct depiction by the beam, suffering from limitation in the improvement of the through put. As an analogues method, there is a dip pen lithographic method based on an atomic force microscopy technique but patterns are prepared one by one in the method, therefore, the method is far from industrial application.

Further, while nano-imprint may be mentioned as a method capable of pattern transfer by a convenient method, but materials to which the imprint is applicable suffer from various limitations and, the fine fabrication accuracy of a template depends on the known lithographic method, thereby, this method does not substantially improve the fine fabrication accuracy.

As has been described above, methods for forming fine patterns known so far involve various limitations or problems. A new fine fabrication method capable of overcoming the problems is sought to be developed.

On the other hand, the present inventors have disclosed nano-level thin films and manufacturing methods thereof such as materials for forming thin films of amorphous metal oxide (JP-A No. 2002-338211), a manufacturing method of organic/metal oxide complex thin films (JP-A No. 10-249985), nano-materials of complex metal oxides (WO 03/095193), etc.

DISCLOSURE OF THE INVENTION

Under the situations described above, the present inventor, as a result of an earnest study, has unexpectedly found that a nano-structure can be manufactured by adsorbing a material in a liquid phase state on the surface of a template to form a thin film and removing the template in the technique for forming a fine pattern. That is, a method of vapor depositing a metallic material or a method of coating by a spin coat method used in the manufacturing technique of fine nano-patterns such as for semiconductors actually suffers from various limitations and involves various difficulties for the manufacture of the nano-structure. That is, they suffer from various limitations for example, on starting materials, structures obtained, manufacturing conditions and cost, therefore, they are difficult to be put to practical use.

The present invention has been found a method of forming a nano-structure with extremely less limitations than usual of dissolving the problems described above by adsorbing a material in a liquid phase state on the surface of a template.

Specifically, it has been attained by the following means.

(1) A method of forming a nano-structure comprising forming a thin film by a liquid phase adsorption on surface of a template formed on a substrate, removing a portion of the thin film, and removing the template.

(2) The method of forming a nano-structure according to (1), wherein a portion of the template is exposed by the removing of the portion of the thin film.

(3) A method of forming a nano-structure comprising forming a first thin film on surface of a first template formed on a substrate, forming a second template on the surface of the first thin film, forming a second thin film on the surface of the second template, removing a portion of the first thin film and/or the second thin film simultaneously or separately, and removing the first template and/or the second template simultaneously or separately, wherein at least one of the forming of the first thin film, the forming of the second template, and the forming of the second thin film is conducted by liquid phase adsorption.

(4) The method of forming a nano-structure according to (3), wherein material of the first thin film differs from that of the second thin film.

(5) The method of forming a nano-structure according to (3) or (4), wherein the forming of the first thin film, the forming of the second template, and the forming of the second thin film are conducted continuously.

(6) The method of forming a nano-structure according to any one of (1) to (5), wherein the thin film is formed by a sol-gel method.

(7) The method of forming a nano-structure according to any one of (1) to (5), wherein the thin film is formed by a sol-gel method using a metal alkoxide.

(8) The method of forming a nano-structure according to any one of (1) to (5), wherein the thin film is formed by stacking by a sol-gel method for one or more times.

(9) The method of forming a nano-structure according to any one of (1) to (8), wherein the thin film is formed at 0 to 150° C.

(10) The method of forming a nano-structure according to any one of (1) to (9), wherein the thin film is formed under $1.0 \times 10^6$ Pa or lower.
(11) The method of forming a nano-structure according to any one of (1) to (10), wherein the template is the nano-structure formed by the method according to any one of (1) to (10).
(12) The method of forming a nano-structure according to any one of (1) to (11), comprising forming a template on the surface of the nano-structure formed by the method according to any one of (1) to (11).
(13) The method of forming a nano-structure according to any one of (1) to (12), wherein the thin film comprises one or more selected from the group consisting of metal oxides, organic/metal oxide complex, organic compounds, and organic/inorganic complex.
(14) The method of forming a nano-structure according to any one of (1) to (13), wherein the template comprises an organic compound.
(15) The method of forming a nano-structure according to any one of (1) to (14), wherein the thickness of the thin film is 100 nm or less.
(16) The method of forming a nano-structure according to any one of (1) to (14), wherein the thickness of the thin film is from 10 to 50 nm.
(17) The method of forming a nano-structure according to any one of (1) to (16), the surface of template is not planar.
(18) The method of forming a nano-structure according to any one of (1) to (17), the template has a size of 1 $cm^3$ or more.
(19) The nano-structure obtained by the method according to any one of (1) to (18).
(20) The nano-structure according to (19), having self-sustainability.

DETAILED DESCRIPTION OF THE INVENTION

Figure 1:
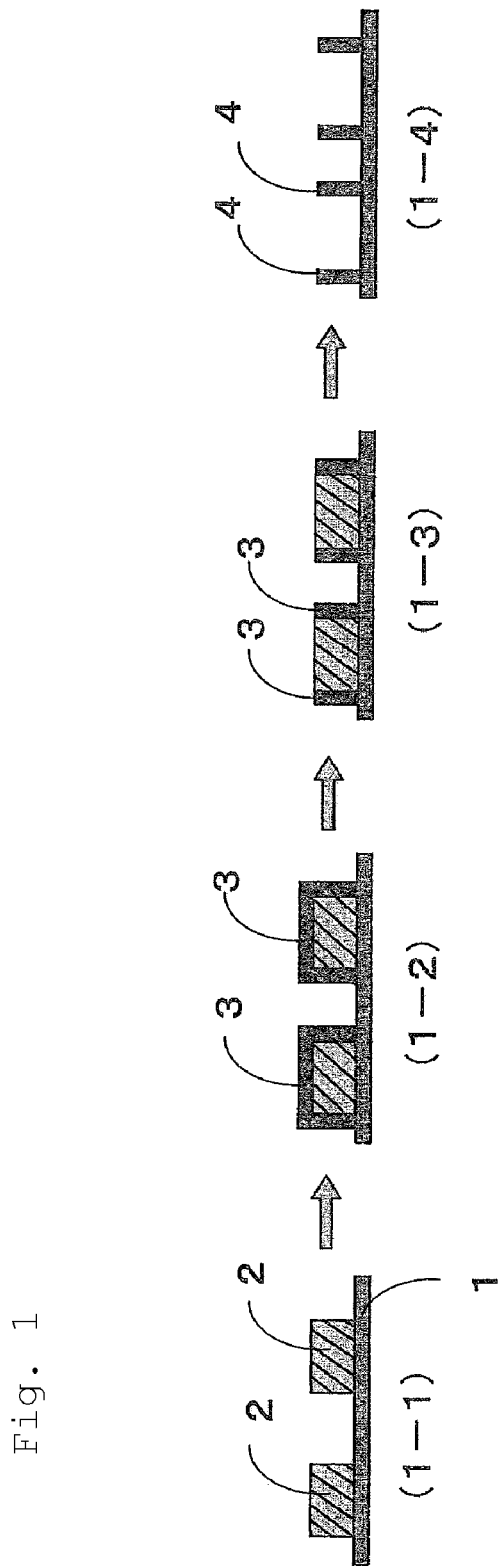
FIG. 1 shows a schematic view of the first embodiment of the invention.

In the followings, the content of the invention is to be described specifically. In the specification of the present application " - - - to - - - " is used in the meaning of including numerical values described before and after thereof as a lower limit value and an upper limit value.
(1) Kind of Thin Film
The thin film of the invention is not particularly limited so long as it does not depart the gist of the invention and includes, for example, one or more member selected from the group consisting of metal oxides, organic/metal oxide complex, organic compounds, and organic/inorganic complex. Particularly, the invention has a feature capable of using a material containing an organic compound for forming a thin film since a thin film material in a liquid phase state is adsorbed in contact with a template. Heretofore, fine fabrication used in semiconductor industries, and the like has been conducted by the means of vapor deposition of a metallic material in a gas phase state or spin coating the same in a liquid phase state. However, the vapor depositing the thin film material in the gas phase state imposes various limitations, for example, organic materials of high molecular weight can not substantially be vapor deposited. Further, since the spin coating method is a method of physically coating a material in a liquid phase state, it can not be substantially coated uniformly on a surface being an uneven surface or complicating shapes. The present invention has overcome the problems by using a technique of adsorbing the thin film material in a liquid phase state on the surface of a substrate and made it possibly to be applicable also for the materials containing organic compounds.

Further, in the method of the invention, in a case of constituting a thin film with two or more kinds of materials, since they are in contact with a template in the liquid phase state, the compositional ratio can be controlled easily. In addition, successive stacking of two or more kinds of the materials can also be conducted by an easy operation.

The material for the thin film in the invention preferably includes for metal oxides, specifically, those containing silicon, titanium, zirconium, and hafnium. Further, thin film materials of amorphous metal oxides having a structure which is removed with a portion corresponding to organic ingredients of the organic/metal oxide complex thin film in which the organic ingredients are molecularly dispersed as described in JP-A No. 2002-338211, a thin film material comprising a polymeric thin film layer, and one of a metal oxide thin film layer and an organic/metal oxide complex thin film layer, wherein the polymeric thin film layer has hydroxyl groups or carboxyl groups on the surface thereof, and the hydroxyl groups or the carboxyl groups combine the metal oxide thin film layer or the organic/metal oxide complex thin film layer therewith through a coordination bond or a covalent bond as described in International Publication WO03/095193, and the like can be used preferably. Further, also a metal oxide thin film, an organic compound thin film, and complex thereof as described in JP-A No. 10-249985 can be used preferably.

As the organic compound, polyanions and/or polycations which are polymers having static charges are preferred. The polyanions are those having functional groups capable of being charged negatively such as polyglutamic acid, sulfonic acid, sulfuric acid, and carboxylic acid, and include, as preferred examples, polystyrene sulfonic acid (PSS), polyvinyl sulfuric acid (PVS), dextran sulfuric acid, chondroitin sulfuric acid, polyacrylic acid (PAA), polymethacrylic acid (PMA), polymaleic acid, and polyfumaric acid. Among them, polystyrene sulfonic acid (PSS) and polymaleic acid are particularly preferred. On the other hand, the polycations are those having functional groups capable of being charged positively such as quaternary ammonium groups and amino groups and include, as preferred examples polyethylene imine (PEI), polyallylamine hydrochloride (PAH), polydialyldimethyl ammonium chloride (PDDA), polyvinyl pyridine (PVP), and polylysine. Among them, polyallylamine hydrochloride (PAH) and polydiallyldimethyl ammonium chloride (PDDA) are particularly preferred.

In addition to the polycations or polyanions described above, high molecular compounds having hydroxyl groups or carboxyl groups such as polyacyrlic acid, polyvinyl alcohol, and polypyrrole, polysaccharides such as starch, glycogen, alginic acid, carrageenan, and agarose, polyimide, phenol resin, polymethylmethacrylate, polyamide such as acrylamide, polyvinyl compound such as vinyl chloride, styrenic polymer such as polystyrene, polythiophene, polyphenylene vinylene, polyacetylene, and derivatives of the polymers and copolymers can also be used generally.

Furthermore, functional polymeric ions such as of conductive polymers and poly(aniline-N-propane sulfonic acid) (PAN), various deoxyribonucleic acids (DNA) or ribonucleic acids (RNA), proteins, oligopeptides, polysaccharides having static charges such as pectin, or biomacromolecules having static charges can also be used.

Further, organic compounds of low molecular weight are also preferred and, for example, organic compounds of low molecular weights having functional groups such as hydroxyl group, carboxyl groups and amino group, capable of inter-interacting with metal oxides such as metal alkoxides can also be utilized generally and they preferably include, for example, saccharide compounds such as glucose and maltose and derivatives thereof, dye compounds such as terephthalic acid or fluoresceine and amino acids such as glutamic acid.

In a case of forming the thin film only with the organic compound, the organic compound has to be selected properly depending on the film forming means. For example, in a case of forming the thin film by an alternate adsorption method, alternate stacking of polyanions or polycations can be mentioned. Further, any of the organic polymeric ions such as polyanions or polycations is water soluble or soluble to a liquid mixture of water and/or organic solvent. Further, for improving the mechanical strength of the organic thin film, an operation for improving the thin film strength by a crosslinking treatment by a crosslinker or thermal treatment, electrical treatment, or chemical treatment can be utilized properly.

The thickness of the thin film of the invention can be determined properly depending on the thickness of the nano-structure intended to be obtained. Particularly, in the method of the invention, the nano-structure having the thickness of 100 nm or less, preferably the thickness of from 1 to 50 nm, is used as a fine pattern such as semiconductors.

Further, the present invention is profitable in that by adjusting the size of the template and the material, the thin film in that those having self-sustainability, and having a height of from 5 to 500 nm and a width of from 2 to 100 nm, preferably, a height of from 10 to 300 nm and a width of from 1 to 50 nm is obtained.

The thin film used in the invention does not necessarily consist of only one kind but two or more of them can be also be used. In this case, plural kinds of thin films may be formed in a layer state on the surface of one template to a thin film (for example, thin film formed by stacking a metal oxide layer and an organic compound layer) and different thin films may also be formed respectively on plural templates.

(2) Thin Film Forming Method

In the thin film of the invention, a method of adsorbing the material in the liquid phase state on the surface of the template can be used, being preferably a method of chemical adsorption on the surface of the template. The liquid phase adsorption is adsorption of a liquid on a surface of a template by contacting the material in a liquid state on the surface of the template, thereby, forming the adsorption material into a thin film state and, for example, it is preferred to contact the material in a liquid state on the surface of the template to form a thin film by a surface sol-gel method. By the surface sol-gel method, the adsorption amount can be adjusted, as a result, the film thickness can be controlled, and the adsorption material can be extremely easily formed into complex.

Since the gas phase adsorption results in gas exhaust, the facility is expensive, and since the size of the chamber keeping the depressurization condition delimits the coating of the surface, the nano-structure that can be formed is also limited. Further, since the adsorption gas is deposited, no uniform thin film can be formed to a portion of the back side to the depositing direction. That is, this can be used only to a substrate having a uniform surface with no dents. In the method of the invention, since the material in the liquid phase state is adsorbed to form a thin film, the thin film can be formed with no limitation on the shape of the substrate.

Further, by conducting the liquid phase adsorption as in the invention, since the reaction can be controlled easily by temperature control for the solution, the adsorption amount of the thin film material can be adjusted easily and a much finer structure can be easily formed.

More specifically, in a case of the surface sol-gel method, it can be formed by repetitively dipping the surface of the template where functional groups reacting with the metal alkoxide are exposed with the metal alkoxide solution, for example, in accordance with the method described in JP-A No. 2002-338211. A metal oxide thin film is formed from a solution by stepwise adsorption of the metal alkoxide. The metal oxide thin film formed by the method is controlled for the thickness at an accuracy of a nanometer level. Then, the super thin film of the metal oxide is formed of polycondensation of the metal alkoxide and the coating accuracy for the template can be corresponded as far as the molecular level. Accordingly, the template structure having a shape at a nanometer level can be accurately copied in view of the shape.

The temperature upon thin film formation is, preferably, from 0 to 150° C., more preferably, from 10 to 100° C. and, further preferably, from 10 to 50° C. With such a temperature range described above, materials sensitive to heat can also be used with no limitation.

Further, in the invention, the thin film can be formed in the vicinity of a normal pressure. The vicinity of the normal pressure means that a thin film can be formed with no particular application of pressure and, for example, also at $1.0 \times 10^6$ Pa or lower a thin film can be formed. In this invention, since the thin film can be formed in the vicinity of the normal pressure as described above and no expensive chamber is necessary for keeping the pressurized state, it is extremely effective.

For the metal alkoxide, typical compounds include metal alkoxides, for example, metal alkoxide compounds such as titanium butoxide ($Ti(O''Bu)_4$), zirconium propoxide ($Zr(O''Pr)_4$), aluminum butoxide ($Al(O''Bu)_4$), niobium butoxide ($Nb(O''Bu)_5$), and tetramethoxy silane ($Si(OMe)_4$); metal alkoxides having two or more alkoxide groups such as methyltrimethoxy silane ($MeSi(OMe)_3$), diethylethoxy silane ($Et_2Si(OEt)_2$); and double alkoxide compounds such as $BaTi(OR)_x$.

Further, metal oxide precursors, for example, isocyanate metal compounds ($M(NCO)_x$) having two or more isocyanate groups such as tetraisocyanate silane ($Si(NCO)_4$), titanium tetraisocyanate ($Ti(NCO)_4$), zirconium tetraisocyanate ($Zr(NCO)_4$), and aluminum triisocyanate ($Al(NCO)_3$) and, further, metal halide compounds ($MX_n$ wherein M represents a metal, X is one member selected from F, Cl, Br, and I, and n is an integer of 2 to 4) such as tetrachlorotitanium ($TiCl_4$), and tetrachlorosilane ($SiCl_4$) can also be used.

(3) Template

The template of the invention is not particularly limited so long as it does not depart from the gist of the invention. Templates known so far, for example, templates designed by a lithographic method, templates of crystal structure, templates formed by contact printing-imprinting, templates formed by fine mechanical fabrication, templates by LIGA, templates by beam drawing, and templates which are nano-structures formed by the method of the invention (including nano-template complex containing the template in a portion thereof), and templates of such templates formed by applying physical treatment and/or chemical treatment on the surface of the templates can be used. The physical treatment and/or chemical treatment include, for example, polishing, deposition operation of forming a thin film on the surface, plasma treatment, solvent treatment, chemical decomposition of the surface, heat treatment, and stretching treatment.

Among the templates described above, templates designed by the lithographic method are more preferred.

The shape of the template can be properly determined in accordance with the shape of an aimed nano-structure, for which rectangular, columnar, linear, and network structure or branched structure thereof, polygonal shape and complex/repetitive structure thereof, and circuit-like structure as found in integrated circuits, or lattice shape can be used. Particularly, the invention is extremely preferred in that the shape of the template has no limitation. That is, in a case of forming a thin film by a vapor deposition technique generally used in the prior semiconductor technique, since deposition can be conducted only to the vapor deposition direction as described above, thin film can not be formed on the template having not a planar surface (for example, templates having unevenness or dents on the surface), a thin film could have not been formed to those having a portion as the back side relative to the depositing direction. The invention has a merit in that the shape of the template is not also limited because of liquid phase adsorption.

Further, the material of the template is preferably determined considering a relation between the template and the thin film formed on the surface thereof. That is, it is preferred to use a template on which an aimed thin film is formed easily or use a template that causes no hindering factor to each other upon removing the thin film or the template. Specifically, it includes, for example, organic compounds, inorganic compounds, metal oxides, organic/inorganic complex materials. The organic compound preferably includes, for example, resist polymers represented by novolac polymer, polyvinyl alcohol, and polyacrylic acid.

For the combination of the template and the thin film, when the thin film comprises a metal oxide or an organic/metal oxide complex, a template comprising an organic compound (for example, a template where functional groups reacting with a metal alkoxide is exposed on the surface) is preferred. When the thin film comprises a metal oxide, a polymer template where hydroxyl groups or carboxyl groups can be exposed to the surface such as a resist polymer represented by a novolac polymer, polyvinyl alcohol, or polyacrylic acid is preferred.

(4) Removing a Portion of Thin Film

While the method of removing the thin film is not particularly limited so long as it does not depart from the gist of the invention, it can be determined properly considering the kind of the thin film and, optionally, the kind of the template. For example, known methods such as etching, chemical treatment, physical treatment, and polishing can be used.

Any of a portion of the thin film, so long as it is a portion of the thin film, may be removed by any manner. Preferably, one plane containing a portion of the thin film is removed preferably. In this case, the one plane may be in parallel with or perpendicular to the substrate, or may have an appropriate angle of inclination. Other removal than described above may of course be used.

Particularly, in a case of using a rectangular template, it is preferred to remove only the upper side (top side) in the thin film on the surface thereof. Thus, only the lateral surface of the thin film is left and, as a result, a nano-structure having a self-sustainability can be obtained.

The thin film is removed preferably by 1 to 99% of the entire portion and, more preferably, by 5 to 95% of the entire portion.

(5) Template Removing Step

The known method of removing the template can be widely used as a method of removing the template. For example, in a case of a template comprising an organic compound, it can be removed, for example, by baking, dissolving, oxygen plasma treatment or the like. As a result of such means, a metal oxide structure having a fine pattern size controlled by the thickness control is formed.

The removing of the template may be applied simultaneously or separately in a case of forming plural templates. In a case of separate removal, it is preferred to remove successively from those present on the inner or lower side. Further, in a case of forming plural templates, it is not necessary to remove all the templates. Further, for a single template may be entirely removed completely, or only the portion may be removed. In a case of removing the portion, it is preferred to remove from 1 to 99% and, more preferably, remove from 5 to 95% of the entire portion. In a case of removing a portion of the template as described above, the nano-template complex containing the template as a portion thereof may be also used in such a state. It can be of course be fabricated further, or fabricated further after transfer to other substrate.

(6) Substrate

The substrate of the invention is not particularly limited so long as it does not depart from the gist of the invention. For example, a smooth substrate may be used, or those formed with some or other protrusions within a range not departing from the gist of the invention may also be used as the substrate. Further, the template and the substrate may also be integrated. In this case, the template and the substrate can also be removed together.

The invention has a feature in that also the material and the surface property of the substrate have no particular limitation. The substrate of any shape can be used so long as the template can be formed.

Specifically, preferred examples include solids comprising metals such as silicon and aluminum, inorganic materials such as, glass, titanium oxide and silica, solids comprising organic materials such as acrylic plates, polystyrene, cellulose, cellulose acetate, and phenol resin or those provided with some or other nano-structures (or nano-template complex including a template to a portion thereof) on the surface thereof.

Further, the substrate used in the invention is used as a base upon forming the nano-structure of the invention, which can be used being detached from the substrate or, further, can be used as a nano-structure being transferred to other substrate.

Further, the template on the substrate means not only the template formed in contact with the substrate but also such a constitution in which a template is formed on the template and/or thin film on the substrate.

Now, preferred embodiments of the invention are to be described with reference to the drawings. Accordingly, it will be apparent that other embodiments than described above are not extruded.

(1) Embodiment (1)

FIG. 1 shows the first embodiment of the invention, wherein a portion of a laterally long shape represents a substrate 1, a hatched portion represents a template 2 and a portion at the periphery of the template represents a thin film 3 (hereinafter, they are identical also with respect to those in or after FIG. 2 unless otherwise specified). At first, a substantially rectangular template 2 is formed on the substrate (1-1). Then, a thin film 3 is formed so as to cover the surface of the template (1-2). The thin film 3 is formed, preferably, by a surface sol-gel method and the thickness of the thin film is preferably controlled by the repetitive number of cycles of the surface sol-gel method. By using such a method, a thin film which is uniform and free from unevenness can be formed. Further, a portion of the thin film is removed by removing the upper side at a plane in parallel with the substrate (particularly preferably, only the top side as a thin film on the upper side of the template) (1-3). In this case, a portion of the template may also be removed together with the top side of the thin film. Then, the template is removed. Then, only the thin film 3 on the lateral surface remains to be formed a nano-level structure 4 (1-4).

That is, in the nano-structure of the invention, the accuracy of the obtained nano-structure can be controlled by adjusting the thickness of the thin film in the step of forming the thin film on the surface of the template. Then, by properly defining the shape of the template, an extremely finer structure can also be formed. Accordingly, the line width when that is to be formed into a wiring circuit can be controlled easily even at a fine level. Further the nano-level structure of this embodiment having a self-sustainability, for example such a thin member vertically standing, can also be formed. The self-sustainability can be preferably obtained more easily by controlling the aspect ratio (width/height) to 1/300 or less in a case of a metal oxide thin film and the aspect ratio (width/height) to 1/100 or less in a case of an organic/metal oxide complex thin film. For obtaining the self-sustainability further more easily, the aspect ratio (width/height) is preferably 1/10 or less in cases of the metal oxide thin film or the organic/metal oxide complex thin film.

It is not always necessary to apply fine fabrication for the template structure covered with the thin film and, from a structure at a centimeter order (for example a template of 1 $cm^3$ or more size), the nano-structure of the invention can be also formed by properly setting the condition for forming the thin film and the condition for removing the template. That is, 2-dimensional pattern having a line width at a nano-meter order can be formed. Such a method is advantageous with a view point that the template structure can be manufactured at a reduced cost.

(2) Embodiment (2)

Figure 2:
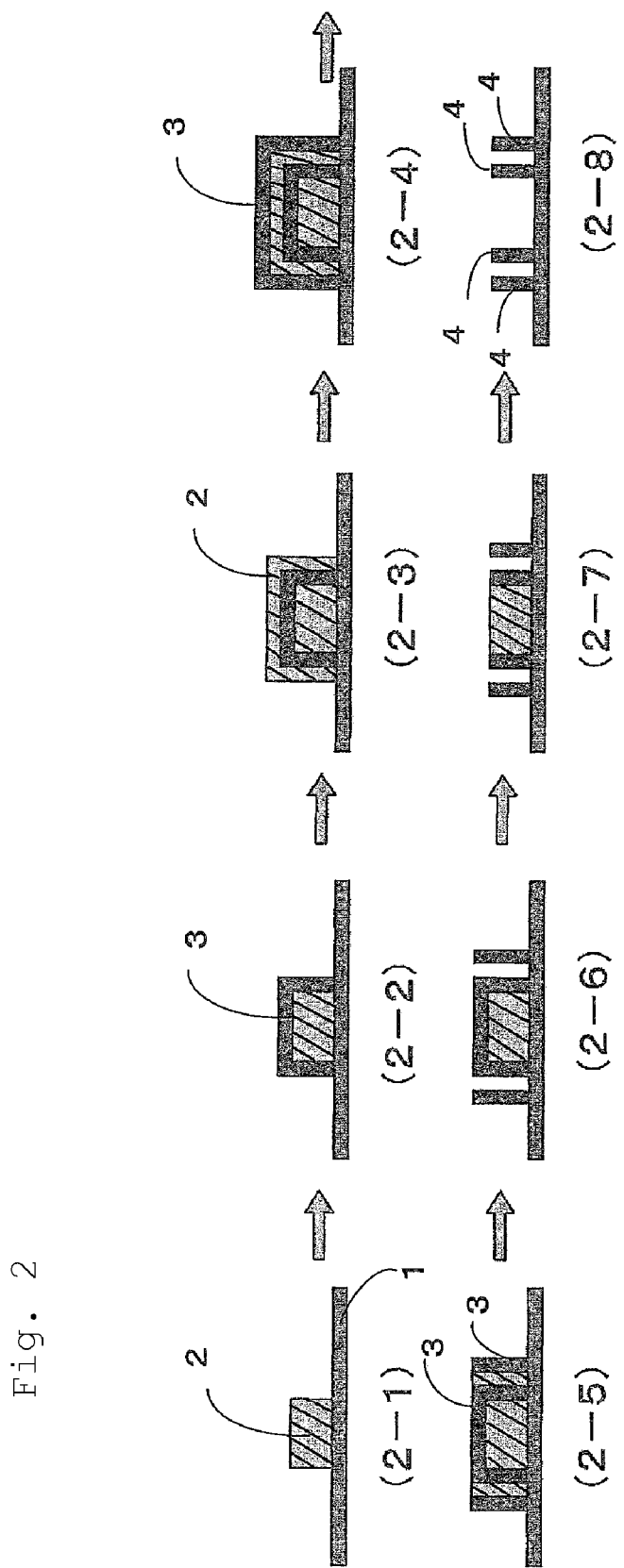
FIG. 2 shows a schematic view of the second embodiment of the invention.

FIG. 2 shows the second embodiment of the invention, wherein plural times of thin film forming are conducted continuously. Continuously means herein that each of the steps such as introduction of a material into an apparatus for forming a thin film, formation of a thin film, and recovery of the specimen from the inside of the apparatus in the process for forming the thin film are conducted simultaneously or successively with no interruption. For example, this is a state different from the treatment such as batch treatment in which each of the steps depends on the preceding and succeeding steps and transfers to the next step after the completion of one step. At first, after forming a template 2 on a substrate 1 (2-1), on the surface of the template a thin film 3 is formed (2-2), and on the surface of the thin film 3 template 2 is further formed (2-3). The size of the template in this case can be determined properly depending on the aimed shape of the nano-structure. Then, a thin film 3 is formed on the surface of the template (2-4). The thin film may be of a material identical with the material of the thin film 3 formed previously or may be different therefrom. Further, while the thickness is substantially identical, it may be of a different thickness. Further, since the thin film is formed by liquid phase adsorption in the method of the invention, it may suffice that the thin film material contact to the template and the steps can be conducted continuously. Then, the surface of the thin film formed subsequently is removed to expose a portion of the template (2-5), the template formed subsequently is removed (2-6) and, further, the thin film formed previously and the template formed previously is conducted as the same (2-7) to obtain a nano-structure 4. In this embodiment, while the template and the thin film are removed stepwise in (2-5) to (2-7), the sides of the two thin films may be removed from the state in (2-4) to the state in (2-7) to remove the two templates at once by a step for once. As described above, the template and the thin film can be formed alternately and, as a result, a more complicate nano-structure can be obtained in the invention.

(3) Embodiment (3)

Figure 3:
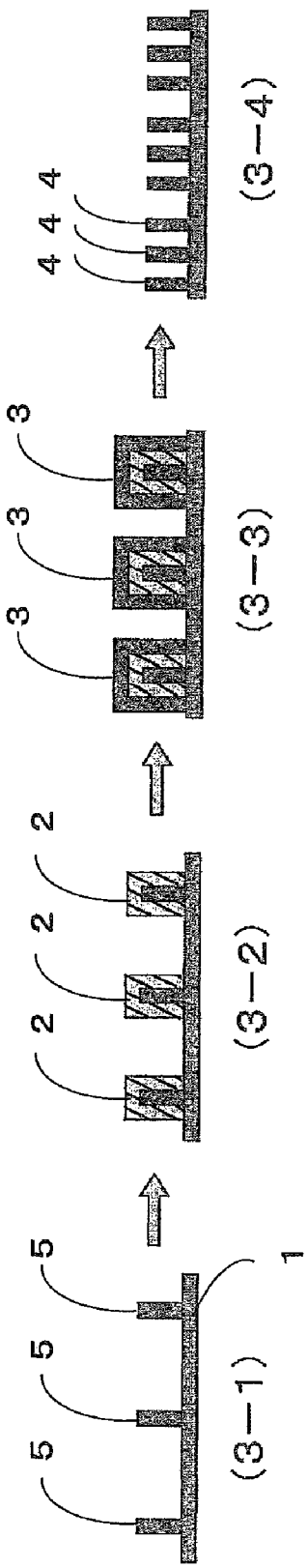
FIG. 3 shows a schematic view of the third embodiment of the invention.

FIG. 3 shows the third embodiment of the invention, wherein a finer nano-structure is formed by using the nano-structure obtained by the method of the invention as a template. That is, on the surface of a nano-level structure 5 (3-1) a template 2 is formed (3-2), and on the surface thereof a thin film 3 is further formed (3-3). Then, the upper side of the thin film formed in (3-3) is removed and, further, the template is removed, thereby, a nano-structure 4 of a complicate shape as shown in (3-4) is obtained. This embodiment has a feature of forming the template on the surface of the nano-level structure and forming the thin film further thereon. In the invention, liquid phase adsorption enables the template to be formed on the surface of the nano-structure comprising such a complicate structure. By using such a complicate structure, a much finer structure can be formed. While it has been extremely difficult to manufacture such a finer structure, the nano-structure as shown in (3-1) can be formed. Thereby, such a nano-structure can be formed easily.

(4) Embodiment (4)

Figure 4:
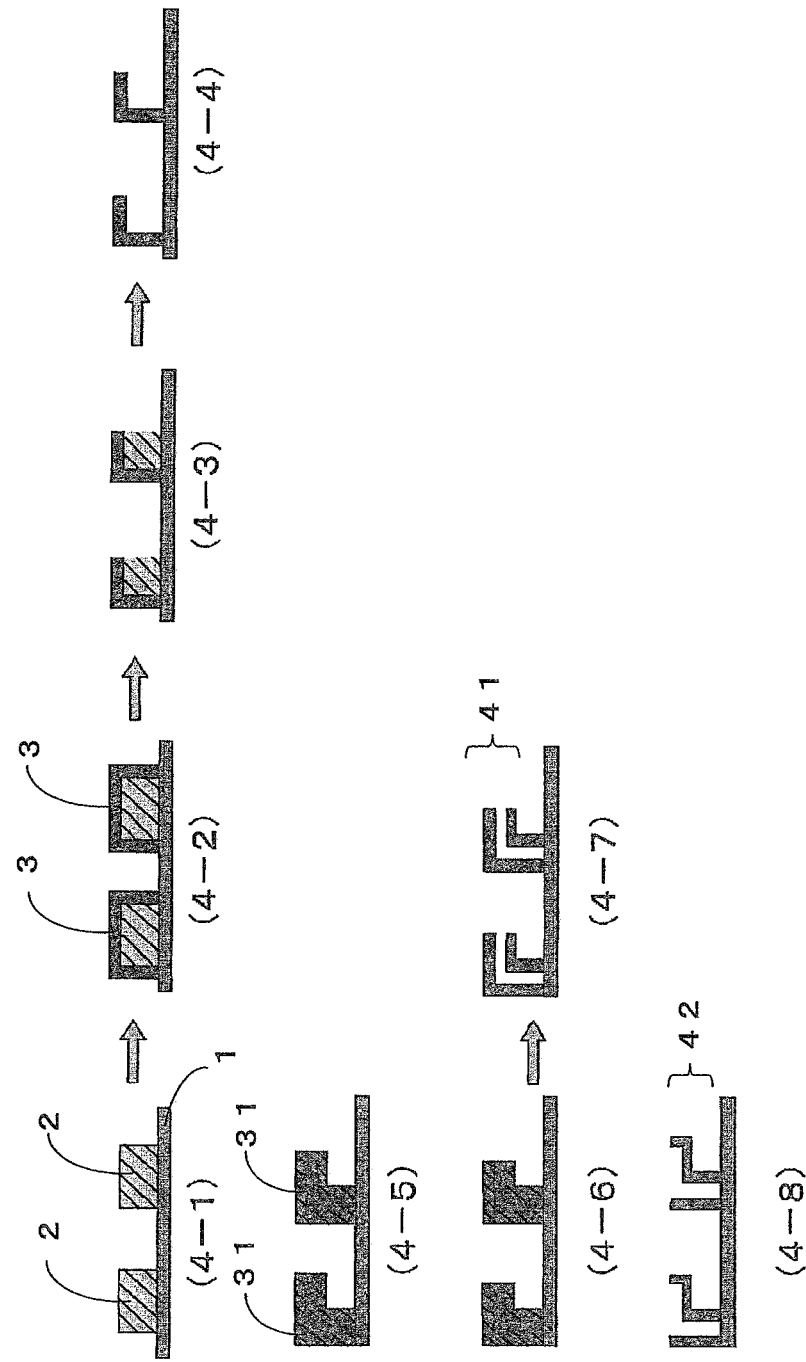
FIG. 4 shows a schematic view of the fourth embodiment of the invention.

FIG. 4 shows an example of a nano-structure of a further complicate shape, wherein a template 2 is formed on a substrate 1 (4-1), on the surface of the template 2 a thin film 3 is formed (4-2), a portion thereof (4-2) is removed so as to be substantially perpendicular to the substrate (4-3). Further, by removing the template, those of the shape shown in (4-4) are obtained. Then, by using the nano-structure as a template, a thin film 31 is formed (4-5). Then, a right portion in (4-5) is removed (4-6) and the template is removed to obtain a nano-structure 41 shown in (4-7). On the other hand, in (4-5) by removing the upper portion and removing the template, a nano-structure 42 shown in (4-8) is obtained.

This embodiment has a feature in obtaining a nano-structure by using the nano-structure formed by using a template as a template. By using this embodiment, a nano-structure of a more complicate structure can be formed. Particularly, the template can be formed by liquid phase adsorption on the surface of the nano-structure having the complicate structure in the invention.

Further, in this embodiment, the thin film and the template are removed at the side substantially perpendicular to the template. Since this embodiment enable to remove the thin film and/or template at the side other than the top side (upper side of the template), a template of a further complicate structure can be preferably formed.

(5) Embodiment (5)

Figure 5:
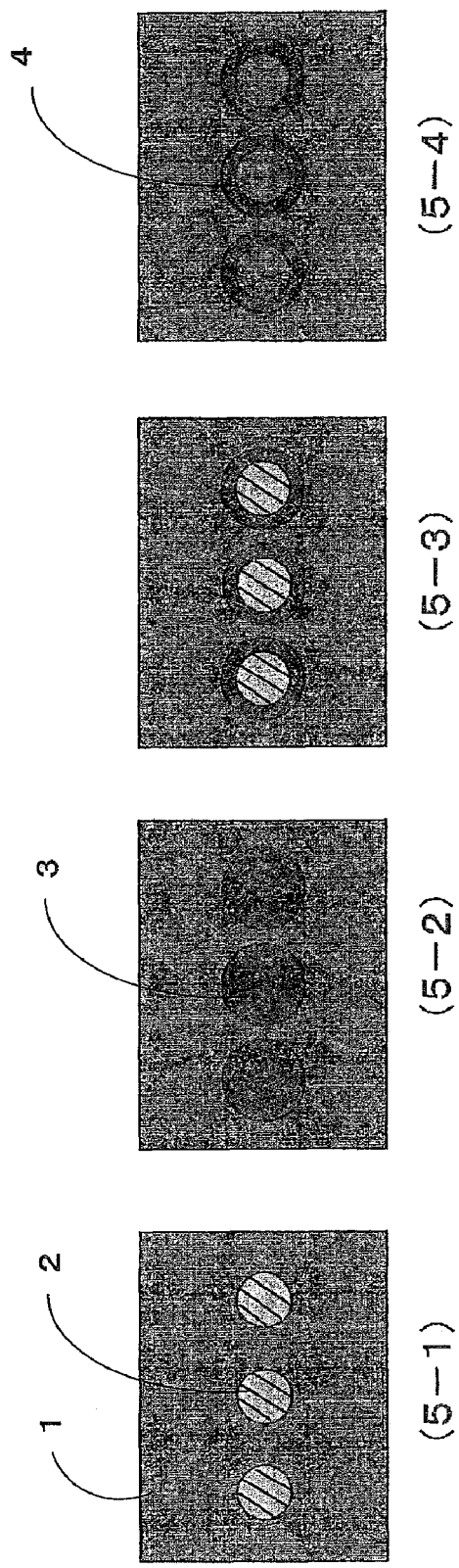
FIG. 5 shows a schematic view of a fifth embodiment of the invention.

FIG. 5 shows the fifth embodiment of the invention, wherein on the surface of a columnar template 2 on the surface of a columnar template 2 (5-1), a thin film 3 is formed (5-2), then, a portion of the thin film is removed (5-3), and the template is removed to form a nano-structure 4 (5-4). As described above, the shape of the template is not limited so long as the thin film can be formed in the method of forming the nano-structure of the invention. Accordingly, nano-structures of various shapes can be formed.

(6) Embodiment (6)

Figure 6:
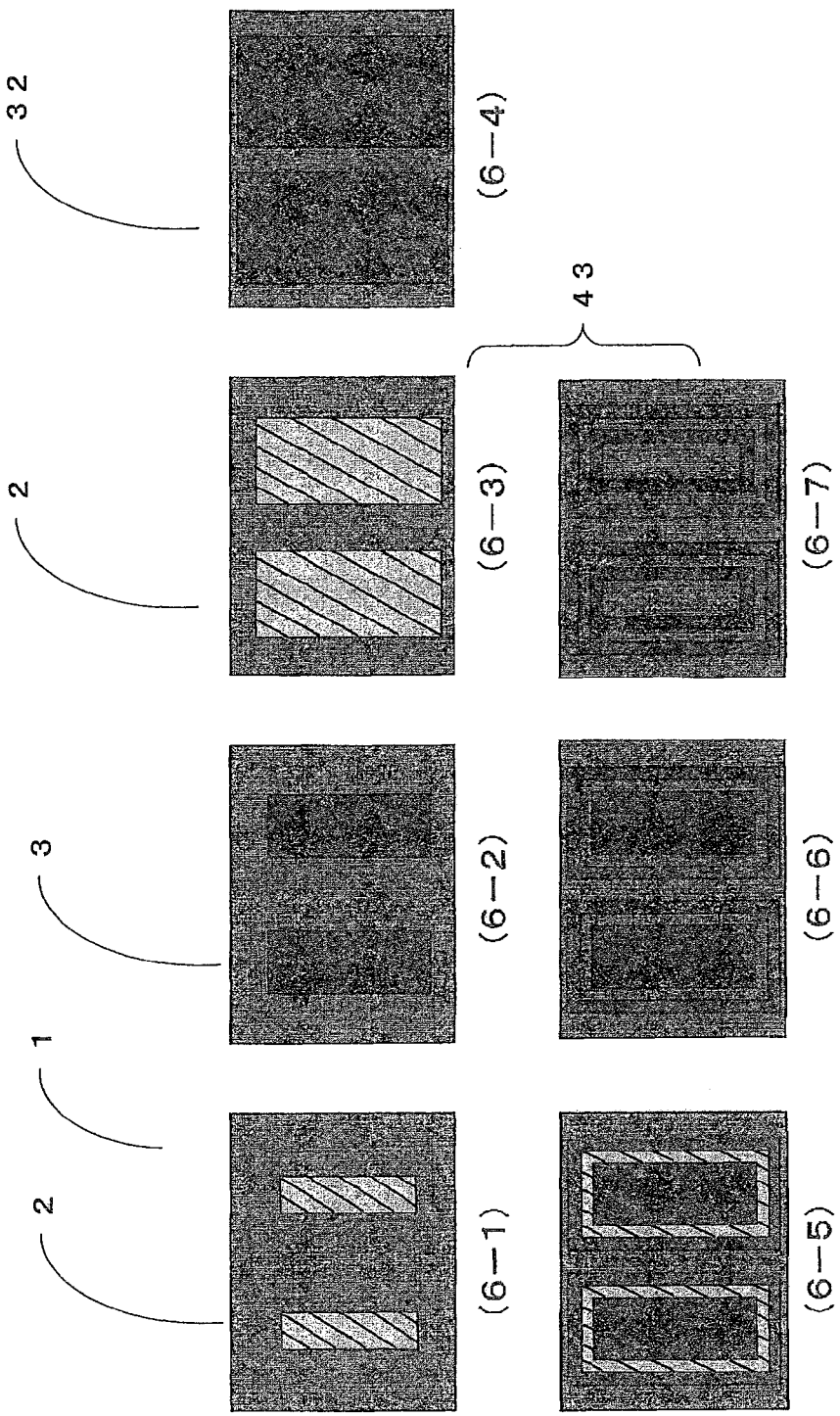
FIG. 6 shows a schematic view of the sixth embodiment of the invention.

FIG. 6 shows the sixth embodiment of the invention, wherein on the surface of a square cylindrical template 2 formed on the substrate 1 (6-1), a thin film 3 is formed (6-2), on the surface of the thin film 3 a template 2 is further formed (6-3), and on the surface a thin film 32 is formed (6-4). The composition of the thin film 32 differ from that of the thin film 3 formed in (6-2). Then, in the same manner as in the embodiment described above, by conducting the operations for removing the thin film (6-5) and removing the template (6-6), a nano-structure 43 having different compositions depending on the portion is obtained (6-7). As described above according to the invention, a nano-structure having different compositions depending on the portions can be formed easily, which is extremely useful. In this embodiment, while an identical kind of the template is used, the template can be changed properly in accordance with the kind of the thin film to be formed on the surface thereof. As described above, in the invention, plural times of forming of thin film are conducted and different thin film materials can be used respectively for the corresponding thin film formation and, as a result, a more complicate nano-structure can be easily formed. Further, the compositional ratio can also be easily controlled.

(7) Embodiment (7)

Figure 7:
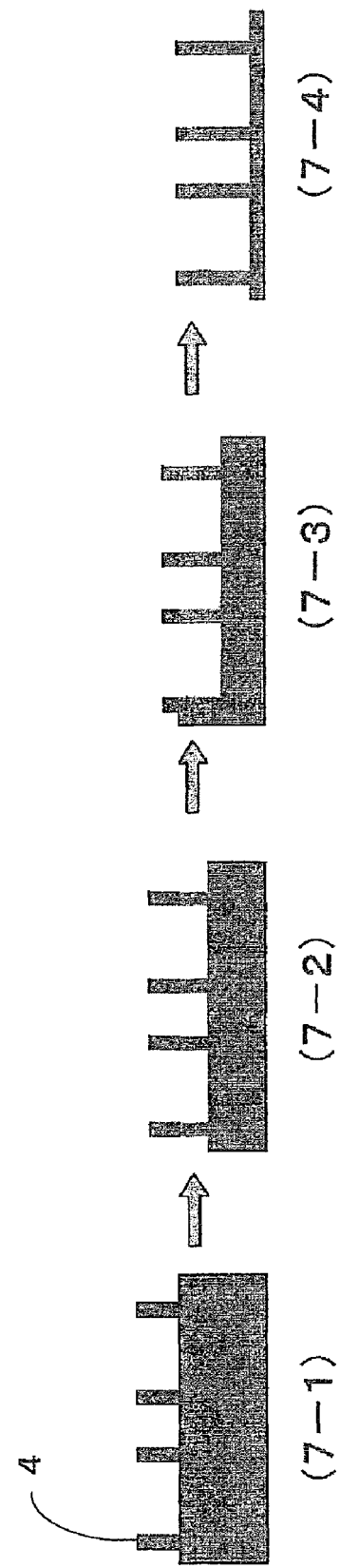
FIG. 7 shows a schematic view of the seventh embodiment of the invention.
Figure 8:
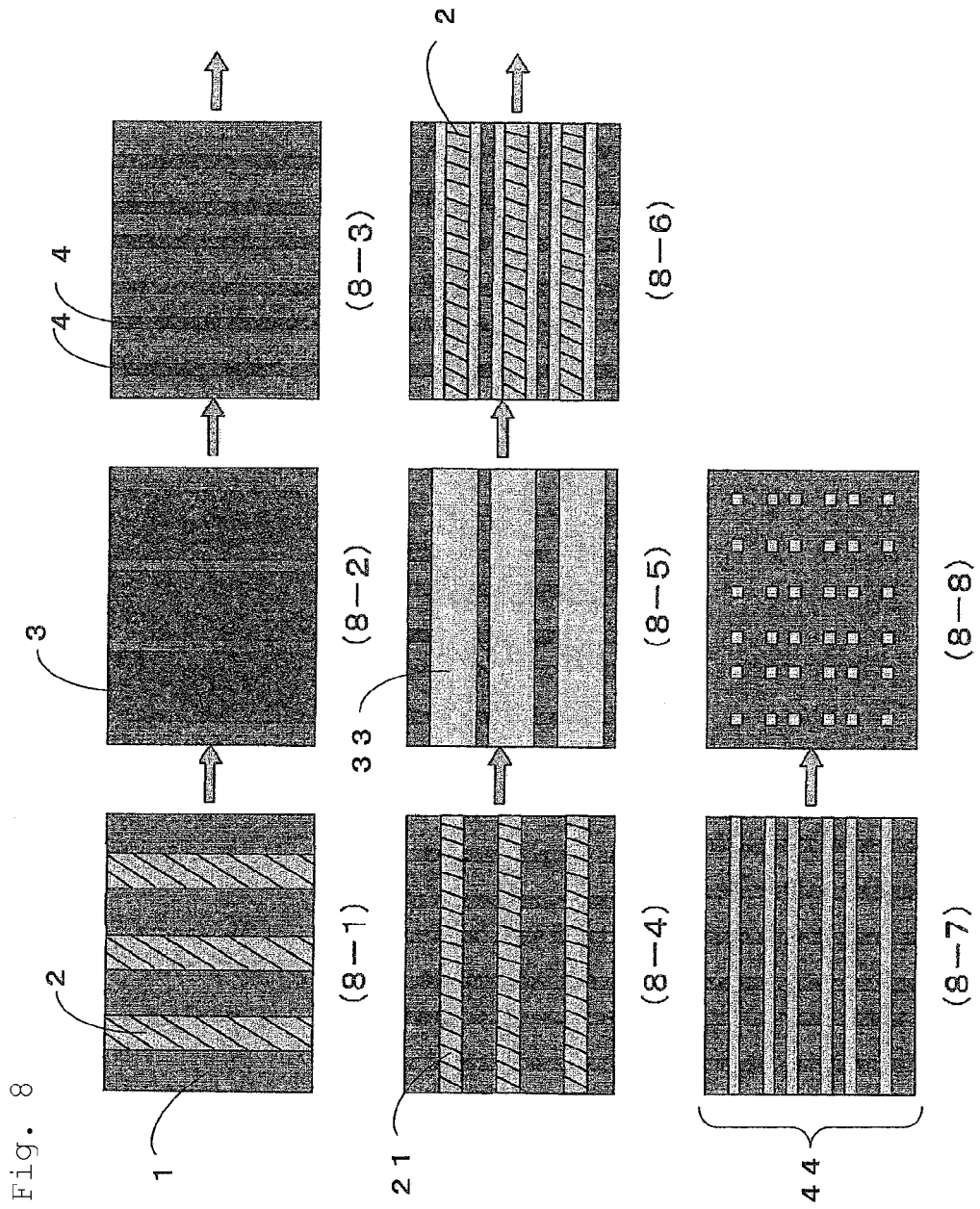
FIG. 8 shows a schematic view of the eighth embodiment of the invention.

FIG. 7 shows one of application examples for a nano-structure obtained by the invention, wherein the nano-structure 4 obtained in the embodiment (1) described above is used as an index (7-1), and the substrate portion and the thin film are removed successively (7-2, 7-3). Then, a structure at a nano-level consisting only of the substrate material is finally obtained (7-4).

It is of course possible to form a nano-structure comprising a substrate and a thin film while leaving a portion of the thin film.

(8) Embodiment (8)

Fig, 8 shows a further application example of a nano-structure obtained according to the invention, wherein a columnar template 2 with one side being longer than the other side is formed on a substrate 1 (8-1), on the surface of the template 2 a thin film 3 is formed (8-2) and, after removing a portion of the thin film 3, the template 2 is removed to obtain a nano-structure 4 (8-3). Then, on a substrate containing the surface of the nano-structure a template 21 elongate in the direction perpendicular to that described previously is formed (8-4). In this case, the substrate at this stage has no smooth surface but is in a state with uneven surface. That is, the template in (8-4) is concave to the substrate. Then, on the surface of the template a thin film 33 of a composition different from that of the thin film described above is disposed (8-5), a portion of the thin film 33 is removed (8-6), and the template 21 is removed to obtain a nano-structure 44 (8-7).

This embodiment has a feature in that a nano-structure is formed further on the surface where some or other nano structure is disposed on the surface of the substrate. In the existent method, such a complicate constitution can not have substantially been formed. With the view point described above, the invention is extremely superior.

Further, by optionally conducting the same method as in Embodiment (7), it is possible to remove the thin film and the substrate portion to form a structure as in (8-8).

(9) Embodiment (9)

Then, an embodiment of forming a porous nano-structure is to be described. That is, a thin film material (for example, metal oxide precursor) and a template for forming a porous material (hereinafter referred to as "template for porous material") are mixed on the surface of the template to form a thin film (metal oxide thin film containing the template for porous material) on the surface of the template formed by the same method as described above. Then, after forming the thin film, the template for porous material is removed to obtain a thin film having a structure reflecting the shape of the template for porous material (porous structure). Then, a portion of the obtained porous thin film is removed and the template is removed by the same manner as the method described above to manufacture a porous nano-structure. The manufacture is possible by the method described above only when conducting the liquid phase adsorption.

The method of removing the templates for use in porous material includes, for example, a plasma treatment, an acid treatment, and an alkali treatment.

The material of the template for porous material can be determined properly depending on the size of the porous material, materials for the thin film, the template and the like, and organic compounds, metal ions, metal complexes, biomacromolecule such as proteins or nucleic acids, fine metal particles, fine organic particles, and the like, can be generally applied. The template for porous material preferably have functional groups by which the template for porous material and the thin film material can be reacted with each other such that the thin film material and the template for porous material preferably interact. In a case of using a metal alkoxide for the thin film material, it preferably has, for example, carboxyl groups, amino groups and hydroxyl groups and, more preferably, carboxyl groups or hydroxyl groups. Further, those having electrostatic interaction as the interaction are preferred. Generally, metal oxides often have negative static charges and, while those having positive charges are preferred as the molecule in this case, they are not limited. The grain size of the template for porous material is preferably from 1 to 50 nm.

The porosity of the porous nano-structure of the invention formed on the template for porous material can be controlled easily depending on the content of the template for porous material to be mixed, and the porosity can be, for example, from 1 to 99% and, more preferably, from 10 to 90%.

The porous nano-structure as described above can be used preferably as catalyst filters, filtration filters, and the like.

EXAMPLE

The present invention is to be described more specifically referring to examples. Materials, amount of use, ratio, content of treatment, treatment procedures, and the like shown in the following examples can be changed properly so long as they do not depart from the gist of the invention. Accordingly, the scope of the invention is not limited to the specific examples shown below.

Example 1

A silicon wafer substrate having an organic resist (TDUR-P015 PM: trade name of products manufactured by Tokyo Oka Industry) in which a rectangular line structure of 340 nm width and 400 nm height was formed by a lithographic method was applied with an oxygen plasma treatment (10 W, 180 mTorr pressure). Then, it was dipped in a 10 mL solution of silicon tetraisocyanate ($Si(NCO)_4$) in (100 mM heptane) at a room temperature and a normal pressure for 2 min, then dipped in 10 mL of hexane for one min, further dipped in 10 mL of deionized water for one min, and finally dried in a nitrogen gas stream. A series of the procedures (surface sol-gel operation) were conducted for 15 times to form a micro thin silica film on the surface over the substrate (film thickness: 50 nm). Further, it was again applied with the oxygen plasma treatment (30 W, 2 hours). After exposure, the upper side was etched under argon by a beam current of 80 mA at 400 V for 2 min. Successively, the substrate was again applied with the oxygen plasma treatment (30 W, 2 hours).

Figure 9:
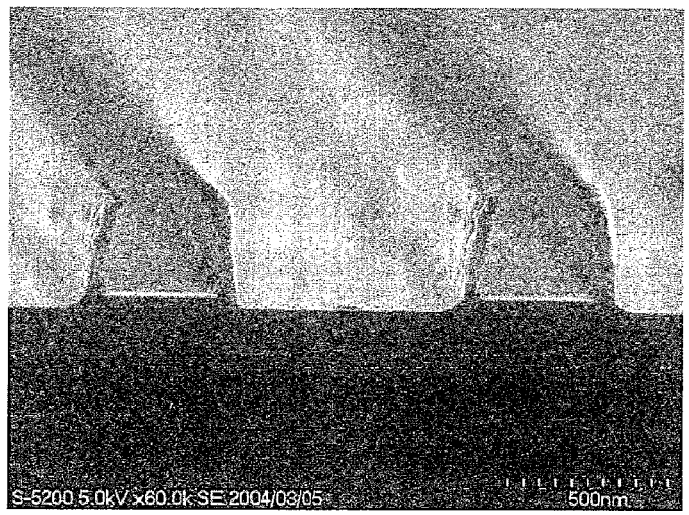
FIG. 9 is a photograph showing the nano-structure obtained in Example 1.

FIG. 9 shows the result in which it was recognized that silica lines (nano structure) of about 50 nm width and about 400 nm height were formed. Further, it was recognized that the upper side of the line was extremely smooth. Further, it can be seen that the silica line has a high aspect ratio to the line width (the height/width: about 8 in this case), and the silica line is held in a self-sustainable manner.

Example 2

A silicon wafer substrate having an organic resist (TDUR-P015 PM trade name of products, manufactured by Tokyo Oka Industry) in which a rectangular line structure of 340 nm width and 400 nm height was formed by a lithographic method was applied with an oxygen plasma treatment (10 W, 180 mTorr pressure). Then, it was dipped in a 10 mL solution of silicon tetraisocyanate ($Si(NCO)_4$) in (100 mM heptane) at a room temperature and a normal pressure for 2 min, then dipped in 10 mL of hexane for one min, further dipped in 10 mL of deionized water for one min, and finally dried in a nitrogen gas stream. A series of the procedures (surface sol-gel operation) were conducted for 15 times to form a micro thin silica film on the surface over the substrate. Successively, it was again applied with the oxygen plasma treatment (exposed for 5 hours at 30 W and the successively for 4 hours at 50 W). Successively, it was applied with a baking treatment (450° C. for 5 hours) and, after exposure, the upper side over the substrate was etched under argon by a bean current of 80 mA at 400 V for 2 min. Successively, the substrate was again applied with the oxygen plasma treatment (30 W, 2 hours).

Figure 10:
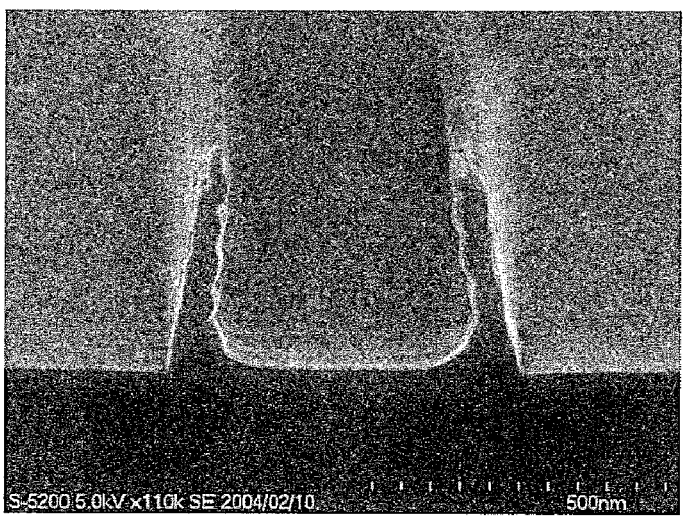
FIG. 10 is a photograph showing the nano-structure obtained in Example 2.

FIG. 10 shows the result in which it was recognized that silica lines of about 50 nm width and about 400 nm height were formed. Also in this case, it can be seen that silica lines are maintained in a self-sustainable manner as described previously.

Comparative Example 1

In Example 1, in a case of using polyvinyl alcohol instead of silicon tetraisocyanate and changing the dipping temperature from the room temperature to 450° C., it could not be dipped in polyvinyl alcohol due to evaporation of the solvent and decomposition of polyvinyl alcohol and no thin film was obtained.

Comparative Example 2

In Example 1, in a case of using polyacrylic acid instead of silicon tetraisocyanate and changing the dipping temperature from the room temperature to 450° C., it could not be dipped in polyacrylic acid due to evaporation of the solvent and decomposition of polyacrylic acid and no thin film was obtained.

Comparative Example 3

In Comparative Example 1, formation of a thin film was attempted by vapor depositing polyvinyl alcohol at 100 Pa but polyvinyl alcohol was not vaporized and vapor deposition could not be conducted. 100 Pa is a pressure in the general vapor deposition procedure.

Comparative Example 4

In Comparative Example 2, formation of a thin film was attempted by vapor depositing polyacrylic acid at 100 Pa but polyacrylic acid was not vaporized and vapor deposition could not be conducted. 100 Pa is a pressure in the general vapor deposition procedure.

Example 3

In Example 1, a ultrathin film was formed by alternately stacking silicon tetraisocyanate and polyacrylic acid by the method described in JP-A No. 2002-338211, column No: 0045 with other procedures being conducted in the same manner. A favorable nano-structure was formed in the same manner as in Example 1.

Comparative Example 5

In Example 3, stacking of silicon tetraisocyanate and polyacrylic acid by gas phase adsorption was attempted, but control for the compositional ratio was difficult in the gas phase state and no uniform film could be formed.

Example 4

A silicon wafer substrate having an organic resist (TDUR-P015 PM, trade name of products manufactured by Tokyo Oka Industry) in which a rectangular line structure of 340 nm width and 400 nm height was formed by a lithographic method was applied with an oxygen plasma treatment (10 W, 180 mTorr pressure). Then, it was dipped in a 10 mL solution of silicon tetraisocyanate ($Si(NCO)_4$) in (100 mM heptane) at a room temperature and a normal pressure for 2 min, then dipped in 10 mL of hexane for one min, further dipped in 10 mL of deionized water for one min and finally dried in a nitrogen gas stream. Then, it was dipped in an ethanol solution of polyacrylic acid (PAA) (1 mg/ml) for 10 min, further dipped and cleaned in ethanol at 25° C. for 1 min, and then dried by blowing a nitrogen gas. A series of the procedures (surface sol-gel operation) were conducted for 15 times to form a super thin film laminate comprising silica and PAA (complex body) on the surface of the template. Further, it was again applied with the oxygen plasma treatment (30 W, 2 hours). After exposure, argon etching was applied under the condition at 400 V and 80 mA of a beam current for 2 min to remove the top side of the thin film. Successively, the substrate was again applied with the oxygen plasma treatment (30 W, 2 hours) to remove the template.

As a result, a silica/PAA complex body of about 50 nm width and about 400 nm height was obtained. Further, the complex body had a self-sustainability.

INDUSTRIAL APPLICABILITY

While radiation rays such as light and electron beams have been utilized so far intending to enhance the miniaturization by the wavelength, according to the invention, in the invention, the size of the fine pattern can be controlled by using a method of controlling the thickness of the thin film with a quite different point of view. Particularly, in the method of forming the nano-structure according to the invention, the width of the finally obtained nano-structure could be controlled to a width of several nm. Further, since such a nano-structure can be formed with no limitation on the size of the substrate according to the method of the invention, it enabled the nano-structure to be formed on a large substrate (for example, 1 cm$^2$ or more and, further, 10 cm$^2$ or more), as well as on a small substrate.

Further, since the method of the invention requires no large scale apparatus, the manufacturing cost can be reduced.

In addition, according to the method of the invention, the process can be conducted continuously under mild conditions.

Furthermore, since the constitution of the invention is not limited for the materials of the thin film or the template and various shapes can be used for the template structure, nano-structures of various shapes can be formed.

Accordingly, the nano-structure and the method therefore of the invention can be widely used, for example, in the field of semiconductors. For example, the method of the nano-structure according to the invention can be used as a method for carrying out nano-imprint. Further, when the nano-structure of the invention comprises metal oxide, a fine metal wire is obtained by reducing the metal oxide.

Since the nano-structure of the invention can provide a material having a structure controlled for the fineness of the shape and the size by the adjustment for the thickness of the thin film, it is applicable to various fields such as nano-structures, super thin film sheets, and ultra-fine metal fibers which have been considered difficult to be manufactured by the fine fabrication technique using electromagnetic waves such as light and electron beams. Further, when the nano-structure of the invention comprises a complex material, a wide range of application uses is expected as bio-functional materials incorporated with proteins such as enzymes and medical materials.

In addition, since the nano-structure of the invention can be obtained as a self-sustainable material by stacking organic/metal oxides complex thin films having various forms at an accuracy of nano-meter, electrical and electronic characteristics, magnetic characteristics and optical functional characteristics which were new per se can be designed. Specifically, it can be used for the manufacture of semiconductor super lattice materials and the design for photochemical reaction or electrochemical reaction at high efficiency. Further, since the manufacturing cost for the nano-material of the invention is extremely lower compared with other means, it can be a practical basic technique such as an optical-energy conversion system, for example, solar cells.

Further, various functionally gradient materials can be manufactured by changing stepwise the lamination ratio of two or more kinds of metal compounds with the nano-material of the invention. Further, by combination with successive adsorption methods for organic compounds proposed variously so far, various types of organic and inorganic complex super thin films can also be designed to manufacture nano-structures having new optical, electronic, and chemical functions.

Further, the nano-structures formed of the amorphous organic/metal oxide complex thin films have lower density than usual nano-structures containing the metal oxides and it can be expected that they are utilized as the super low dielectric constant material and applicable to the manufacture of various kinds of sensors. Particularly it is prospective also as insulative materials for circuits patterned at a size of from 10 to 20 nm or electronic circuits with unevenness, or masking or coating film upon applying super fine fabrication on the solid surface.

In addition, since the nano-structure comprising the amorphous organic/metal oxide complex has an enormous number of molecular size porosity, it can be utilized also the synthesis of new substances utilizing supporting of catalyst and intake for the ions. Further, by incorporation into various kinds of materials, the materials surface can be provided with different chemical, dynamic, and optical characteristics, and application to a photo-catalyst or super hydrophilic surface can also be expected.

What is claimed is:

1. A method of forming a nano-structure comprising forming a first thin film on surface of a first template formed on a substrate, forming a second template on the surface of the first thin film, forming a second thin film on a surface of the second template, removing a portion of the first thin film and/or the second thin film simultaneously or separately, and removing the first template and/or the second template simultaneously or separately, wherein at least one of the forming of the first thin film, the forming of the second template, and the forming of the second thin film is conducted by a liquid phase adsorption.

2. The method of forming a nano-structure according to claim 1, wherein material of the first thin film differs from that of the second thin film.

3. The method of forming a nano-structure according to claim 1, wherein the forming of the first thin film, the forming of the second template, and the forming of the second thin film are conducted continuously.

4. A method of forming a nano-structure comprising forming a thin film by a liquid phase adsorption on a surface of a template formed on a substrate; removing a portion of the thin film; and removing the template, the template having a size of 1 cm$^3$ or more.

5. A method of forming a nano-structure comprising
   i) forming a first thin film by a liquid phase adsorption on a surface of a first template formed on a substrate;
   ii) removing a portion of the first thin film;
   iii) removing the first template, thereby obtaining a first nano-structure;
   iv) forming a second template on a surface of the first nano-structure;
   v) forming a second thin film by a liquid adsorption on a surface of the second template formed on the surface of first nano-structure;
   vi) removing a portion of the second thin film; and
   vii) removing the second template, thereby obtaining a nano-structure.

* * * * *